United States Patent [19]
Tsuji et al.

[11] 4,333,986
[45] Jun. 8, 1982

[54] DIAMOND SINTERED COMPACT WHEREIN CRYSTAL PARTICLES ARE UNIFORMLY ORIENTATED IN A PARTICULAR DIRECTION AND A METHOD FOR PRODUCING THE SAME

[75] Inventors: Kazuo Tsuji; Shuji Yazu; Akio Hara, all of Itami, Japan

[73] Assignee: Sumitomo Electric Industries, Ltd., Osaka, Japan

[21] Appl. No.: 158,136

[22] Filed: Jun. 10, 1980

[30] Foreign Application Priority Data

Jun. 11, 1979 [JP] Japan .................................. 54-73670
May 30, 1980 [JP] Japan .................................. 55-73570

[51] Int. Cl.³ .......................... B22B 9/00; C01B 31/06
[52] U.S. Cl. ....................................... 428/402; 51/309; 72/467; 76/107 A; 252/503; 423/446; 428/408
[58] Field of Search ................... 423/446; 51/307, 309; 252/503, 506, 71; 76/107 A; 72/467; 428/408, 402

[56] References Cited

U.S. PATENT DOCUMENTS

| | | | |
|---|---|---|---|
| 2,992,900 | 7/1961 | Bovenkerk | 423/446 |
| 3,407,445 | 10/1968 | Strong | 423/446 X |
| 3,829,544 | 8/1974 | Hall | 51/307 X |
| 3,949,062 | 4/1976 | Vereschagin et al. | 423/446 |
| 4,049,783 | 9/1977 | Vereschagin et al. | 423/446 |
| 4,104,441 | 8/1978 | Fedoseev et al. | 423/446 X |

*Primary Examiner*—Edward J. Meros
*Attorney, Agent, or Firm*—Wenderoth, Lind & Ponack

[57] ABSTRACT

The invention relates to a diamond sintered compact wherein diamond crystal particles are uniformly oriented in a particular direction and the method for producing the same, and has for an object to provide a diamond sintered compact having a high thermal conductivity particularly suitable for heat sink for use in the field of electronics.

According to the invention, graphite is used as carbonaceous raw material, diamond crystal particles having such elongated shape that the ratio of the length of the long axis to that of the short axis is more than 2 being synthesized in such state that the greater part of the crystal particles have their long axes uniformly oriented in a particular direction, the crystal particles being sintered in the direction of the long axes thereof so that transformation of the graphite into diamond and sintering thereof may be accomplished synchronously. The invention has for an object to obtain a diamond sintered compact suitable for the aforesaid use by degassing reaction system raw material plugged into an air permeable container by heating it in vacuum in order to intercept gaseous components causing a decrease of thermal conductivity at the time of synthesizing diamond from carbonaceous material and a catalytic metal and sintering thereof, subsequently the air permeable part of the said container being sealed by means of soldering material preliminarily placed in contact with the said container.

3 Claims, 10 Drawing Figures

DIAMOND SINTERED COMPACT WHEREIN CRYSTAL PARTICLES ARE UNIFORMLY ORIENTATED IN A PARTICULAR DIRECTION AND A METHOD FOR PRODUCING THE SAME

The invention relates to a diamond sintered compact wherein diamond crystal particles are uniformly oriented in a particular direction and the method for producing the same, and particularly to the method for producing a diamond sintered compact having a high thermal conductivity suitable for heat sink for use in the field of electronics.

With the recent development of ultrahigh pressure and high temperature technology, diamond grinding particles have come to be artificially synthesized. They are used in a large amount for stone cutters, grinding wheels and the like, and the amount is far greater than that of natural diamond. Furthermore, diamond sintered compacts have also come to be produced, and they are extensively utilized in cutting tools and antiwearing tools such as wire drawing dies and the like.

The artificial diamond particles for grinding use available on the market at present are roughly divided into three kinds: diamond for use in stone cutters having a regular cubical crystal form (hereinafter abbreviated as SD); diamond for use in grinding wheels of metal bonding having a substantially cubical form though slightly inferior to SD in the form of crystal (hereinafter abbreviated as MD); and diamond for use in grinding wheels of resin bonding easily crushable and having irregular crystal forms (hereinafter abbreviated as RD). Compared with RD, SD and MD have a mechanical property of high resistance to breakage and a maximum size of $300 \sim 500\mu$.

The diamond sintered compact currently available on the market is produced from diamond material selected from the group comprising the aforesaid SD, MD and RD in conformity with the use by adding thereto a bonding metal, such as Co, Ni, etc. and sintering the whole at a high temperature and pressure under which diamond is thermodynamically stable. The size of the diamond particles is suitably selected between $10 \sim 100\mu$ in conformity with the use. Though such diamond sintered compact is already used in a cutting tool and a wire drawing die as described hereinabove, it has the following defect when applied to heat sink in which the high thermal conductivity of diamond is utilized. If RD which is easily crushed is used as diamond material it is crushed into fine particles during the pressing process even when particles of a relatively large size are selected, whereby the number of grain boundaries per unit length in the direction of thermal conduction is increased and the thermal conductivity is reduced. When SD or MD which is not easily crushed is used, sintering involves greater difficulty compared with the case of RD, and moreover a greater amount of metal bonding material is necessitated due to an increase of the volume in the part of the grain boundary. Thus, the thermal conductivity is reduced compared with the case of a diamond single crystal. The thermal conductivity of the coventional diamond sintered compact is $0.4 \sim 0.8$ cal/cm.sec.°C. It is far smaller than the thermal conductivity of natural diamond crystal type Ia which is 2.2 cal/cm.sec.°C., and is still far short of utilization as heat sink. Though type Ia single crystals account for 99% of the single crystals of naturally produced diamond, the thermal conductivity of Ia type single crystal is insufficient for diamond heat sink. Therefore, among the natural diamond single crystals, type IIa single crystals which have a particularly high thermal conductivity of 5.0 cal/cm.sec.°C. are commonly used for heat sink. The type IIa single crystals, however, are produced in a very small amount, and moreover they are not yet produced on an industrial scale. As a result, they are very expensive and priced even about 10 times as high as type Ia single crystals.

In view of the foregoing, first of all the present invention has started from the conception that a diamond sintered compact having a high thermal conductivity will be obtainable if the number of grain boundaries per unit length in the direction of thermal conduction, which is one of the principal causes of decrease of thermal conductivity, can be reduced by making use of diamond particles having such elongated shape that the ratio of the length of the long axis is more than two relative to that of the short axis. To be more precise, the present invention has for an object to provide a diamond sintered compact having a high thermal conductivity by transforming cabonaceous raw material directly into diamond as diamond crystal particles for constituting a diamond sintered compact, each of the particles being formed into such elongated shape that the ratio of the length of its long axis is more than 2 relative to that of its short axis, the long axis of the greater part of the particles being uniformly oriented in the particular direction of the sintered compact, each of the particles being bonded to each other.

Secondly, the present invention has been accomplished on the basis of the following conception. The fact that type IIa single crystal has a thermal conductivity twice as high as that of type Ia single crystal is attributable to the amount of impurities, particularly nitrogen, contained in the crystal. (For example, see "Physical Properties of Diamond" by R. Bellman, P.387.) In view of the foregoing, a diamond sintered compact having a high thermal conductivity will be obtainable if the diamond particles constituting the sintered compact are replaced by type IIa crystals containing less nitrogen. According to the conventional method for producing a diamond sintered compact, the reaction system comprising carbonaceous material and a catalytic metal was constructed in the atmosphere. Accordingly, even when materials of high purity were used, nitrogen gas adsorbed from the atmosphere and the gaseous component of the pressure medium flow into the reaction system when the said materials are subjected to a high temperature and pressure under which diamond is thermodynamically stable in the ultrahigh pressure high temperature apparatus. Thus, the synthesized diamond particles contain a large amount of nitrogen component and consequently have a low thermal conductivity. Of course, the value of the thermal conductivity of the sintered compact can never be higher than that of the diamond crystal component of the sintered compact. According to the invention, the reaction system is protected from nitrogen gas atmosphere by a simple method thereby enabling to provide a diamond sintered compact having a higher thermal conductivity by about $30 \sim 50\%$ compared with the conventional product. It will be understood that, when the sintered compact according to the invention is intended for use in heat sink, the direction of the long axis, of course, should be utilized as the direction of thermal conduction.

The invention will now be described in more detail in reference to the accompanying drawings.

FIG. 1 shows the range of synthesizing diamond. The line A-B shows the thermodynamic equilibrium line of diamond versus graphite. The line C-D shows the eutectic line of a catalytic metal and carbon. The Ni-C eutectic line is shown in the drawing. The oblique lines bounded by E, F, G and H shows the suitable range of pressure and temperature according to the invention.

Figure 9:
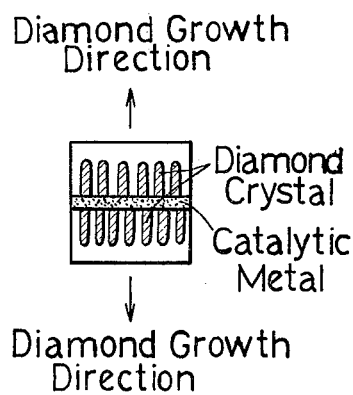
Figure 10:
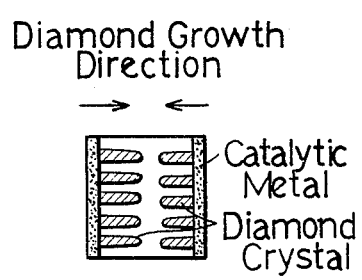

FIGS. 9 and 10 are diagrams for the typical description of the construction of the diamond sintered compact obtainable by the method according to the invention: FIG. 9 shows the state in which the greater part of the said crystal particles have their long axes uniformly oriented in the direction of thickness; FIG. 10 is a sectional view showing the state in which the long axes of the crystal particles of the disk-shaped sintered compact are radially oriented.

As regards the size of individual diamond crystals in the sintered compact according to the invention, the long axis has a length of $50 \sim 400\mu$ while the short axis has a length of $20 \sim 80\mu$ in most cases, that is, the ratio of the length of the long axis is more than 2 relative to that of the short axis. In many cases, the short axis has a length of $40\mu$ and the long axis has a length of $200\mu$. The method for producing a diamond sintered compact having the aforesaid characteristic features will be described in detail hereinunder.

The method according to the invention is characterized by the following two essential features. By making use of graphite as carbonaceous raw material, crystal particles having such elongated shape that the ratio of the length of the long axis is more than 2 relative to that of the short axis are synthesized so that the greater part of the crystal particles have their long axes uniformly oriented in the particular direction of the sintered compact, and such crystal particles are bonded to each other so as to form a continuous diamond phase. One of the points fundamentally different from the conventional technique for obtaining a diamond sintered compact consists in that graphite is used as the starting raw material instead of diamond, and the transformation of graphite into diamond and the sintering thereof are effected synchronously.

Another distinction consists in that the crystal particles are uniformly oriented in the particular direction of the sintered compact. It is a matter of common knowledge that the direction of growth of diamond crystals has a correlation with the direction of infiltration of the eutectic liquid of a catalytic metal and carbon. According to the invention, the said directions can be uniformly oriented in a particular direction by a novel method. Firstly, a layer of metal known to be inert to diamond synthesis is provided on the interface between the catalytic metal and carbonaceous raw material thereby enabling control of the infiltration of the said liquid, and secondly the heating beyond the eutectic temperature of the catalytic metal and carbon is effected particularly quickly. Though the reason why this method enables the synthesized crystals to have their long axes uniformly oriented in the particular direction of the sintered compact is not exactly understood, the following explanation will be acceptable.

Figure 1:
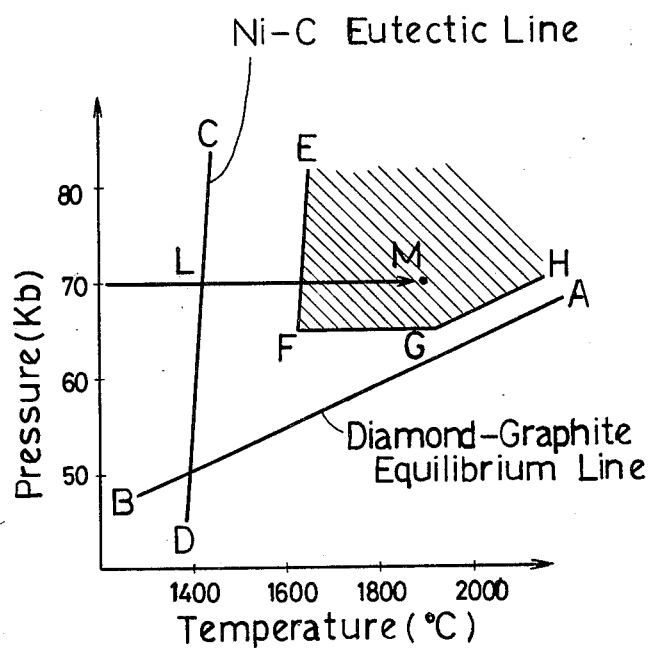

Description will be taken in reference to FIG. 1, which is a phase diagram of carbon under the high pressure and high temperature showing the range of diamond synthesis. The line A-B shows the thermodynamic equilibrium line of diamond versus graphite, the high temperature side above A-B being the stability area of carbon, while the low temperature side is the stability range of diamond. The line C-D is the eutectic line of the catalytic metal and carbon under a high pressure. This line in the drawing shows the Ni-C eutectic line. The range EFGH defined by oblique lines represents the suitable pressure temperature range according to the invention. The line L-M is for describing the temperature elevation, L showing the eutectic temperature while M shows the test temperature.

In the known diamond synthesizing method wherein a metal layer inert to diamond synthesis is not interposed on the interface between the catalytic metal and carbon raw material, a liquid is produced on the interface when the temperature of the reaction vessel reaches the eutectic level (L in FIG. 1) during the temperature elevation. In conformity with elevation of the temperature from L to M, the liquid infiltrates into the carbon raw material synchronously with the production of diamond crystals everywhere. In the neighborhood of L, however, the infiltration of the liquid is slow in speed due to its high viscosity. Thus, diamond crystals are not grown in an elongated shape, and a multiplicity of diamond nuclei are produced everywhere, whereby diamond of fine particles and irregular shape are produced. On the other hand, when a layer of inert metal is interposed, carbon is not brought into direct contact with the catalytic metal even when the temperature L is reached. Therefore, eutectic liquid of the catalytic metal and carbon is not formed until the inert metal has been diffused in the catalytic metal. In other words, the eutectic line C-D is apparently deviated to the high temperature side. Moreover, liquid of low viscosity is obtainable due to higher temperature. Since the speed of infiltration is increased, crystals of elongated shape are more easily obtainable, and the long axes thereof are uniformly oriented in parallel with the direction of growth of the crystals.

When heating beyond the eutectic temperature of the catalytic metal and carbon is quickly effected as in the case of the present invention, the eutectic liquid produced at L in FIG. 1 decreases its viscosity in a short space of time and the liquid of low viscosity quickly infiltrates into the carbonaceous material. As a result, diamond crystals are grown in the direction of the infiltration of the liquid and have an elongated shape thereby, and the long axes thereof are uniformly oriented in the desired direction. On the other hand, when a slow heating is effected, the infiltration of the liquid is slow in speed due to high viscosity thereof. Thus, the produced diamond crystals are not grown in elongated shape and moreover the long axes thereof are not uniformly oriented in the desired direction. For example, when the temperature was elevated from room temperature to L in FIG. 1 in 5 minutes and was elevated from L to M at the rate of 30° C./min., the particles were not uniformly oriented in the direction of the axes but disposed at random in most cases. Moreover, it showed that many of the particles had their long axes in the ratio of length of about 1~1.5 relative to their short axes. In reverse, when a very quick heating was effected by elevating the temperature at the rate of, for example, 1500° C./min. there was increased possibility of the apparatus being broken. Therefore, better results are not necessarily ensured by increasing the speed of temperature elevation. The preferable range is from 100° C./min to 1200°/min.

It will be understood that each of these two methods have individual effect as described hereinbefore, and it will also be understood that these two methods may be employed in combination. In the latter case, far better results are apparently obtainable due to a multiplied effect.

The bonding of the diamond crystal particles having their long axes in the ratio of more than 2 relative to their short axes in length and synthesized in uniform orientation in the direction of their long axes is accomplished by maintaining the pressure and temperature within the preferable range, EFGH, defined by oblique lines in FIG. 1 for a predetermined space of time. Though the said space of time is not generally definable since it depends on the pressure and temperature conditions, the range from 5 to 30 minutes is preferable. If less than 5 minutes, sintering is premature, while if more than 30 minutes, the life of the apparatus is uneconomically reduced.

Now, the second characteristic feature of the invention will be described in detail in reference to a preferred embodiment of the invention wherein the reaction system is protected from nitrogen gas in the production of a diamond sintered compact.

In the method according to the invention, the reaction system comprising carbonaceous material and a catalytic metal is placed in an air permeable and deformable metal container, suitable soldering material being disposed in contact with the said container, the whole being heated in vacuum thereby eliminating the gaseous component contained in the reaction system. Then, the temperature is elevated until the soldering material melts thereby sealing the air permeable part of the container. The reaction system thus prepared is protected from nitrogen gas and transformation of carbonaceous material into diamond is made in a non-nitrogen atmosphere. The synthesized diamond contains a very small amount of nitrogen and has a higher thermal conductivity.

In order that each individual diamond particle thus obtained has a higher thermal conductivity, very careful attention should be paid also to the construction of the sintered compact. Particularly preferable is the construction generally known as a frost in the ground construction wherein each individual diamond particle has an elongated shape with its long axis in the ratio of more than 2 at the least relative to its short axis in length, and the greater part of the diamond particles are uniformly oriented in the direction of the long axes thereof, and moreover each individual particle is bonded to each other so as to form a continuous diamond phase. The reason why very high thermal conductivity is obtainable by such construction may be explainable by the assumption that the number of grain boundaries per unit length in the direction of thermal conduction is decreased when the direction of the long axes is used as the direction of thermal conduction whereby attenuation of phonon due to the scattering is decreased.

The method according to the invention will hereinunder be described in detail in reference to the accompanying drawings.

Figure 2:
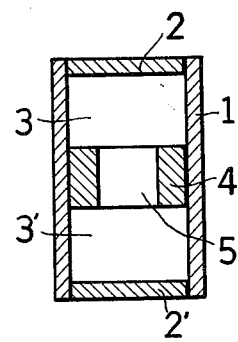
FIG. 2 shows a longitudinal sectional view of an example of a high temperature high pressure vessel for receiving a sample assembly or a sealed container in the production method according to the invention.
Figure 5:
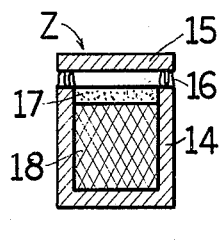
FIGS. 5 and 6 are longitudinal sectional views of an individual sealed container to be inserted into the high temperature high pressure vessel of FIG. 2 and an assembly comprising reaction system materials plugged into the said container.
Figure 6:
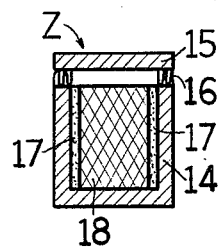
Figure 7:
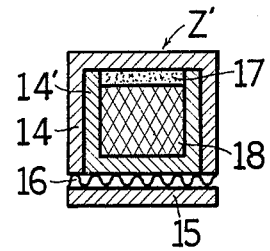
FIG. 7 is a longitudinal sectional view of an assembly when a double-sealed container is used.

FIG. 2 is a structural diagram showing the ultrahigh pressure high temperature apparatus for use in producing a diamond sintered compact according to the invention, wherein the numeral 1 designates a graphite heater, 2 and 2' designating terminal plates made of graphite, 3 and 3' designating BN disks, 4 designating a BN cylinder, 5 designating a sample chamber. In the said sample chamber 5 is placed a partially air permeable container after which is later sealed in vacuum an embodiment of which is shown as an example in FIGS. 5, 6 and 7. FIGS. 5 and 6 show the case of a single container, while FIG. 7 shows the case of a double container, wherein the numerals 14 and 14' designate the containers, 15 designating an upper plate or bottom plate thereof, 16 designating soldering material, 17 designating a catalytic metal, 18 designating carbonaceous material. FIGS. 5 and 6 show an example of the catalytic metal and carbonaceous material being disposed in layers and concentrically in the metal container, respectively. The container shown in FIGS. 5, 6 and 7 has air permeability in the part of the soldering material 16, respectively.

The container is preferably made of metal. The object is not attainable if a glass or ceramic container is used since it is broken in the course of compression and the reaction system is exposed to the atmosphere.

The metal for use in the container preferably has as high a melting point as possible since the reaction system in the container is placed under the condition of more than 1600° C. Thus, Ti, Zr, Hf, V, Nb, Ta, Cr, Mo, W or alloys thereof are preferable materials of the container. The soldering materials may be selected from the group comprising metal solders, such as Ag, Cu, etc., and pure metals, such as Cu, Ni, etc.

According to the method of the invention, an assembled body Z or Z' is produced by placing a catalytic metal and carbonaceous material in a container 14 or 14' shown as an example in FIG. 5 or FIG. 7. Then, the assembled body Z or Z' is placed in a predetermined position in vacuum furnace Y (FIG. 8) having a connection route 19 at the lower end thereof to a vacuum pump and a heater 20 on either side in the inside thereof for degassing the gaseous component contained in the said assembled body Z or Z' by heating in vacuum. Particularly when eliminating nitrogen gas, the degassing should be carefully effected at a high temperature in excess of 1000° C., then the temperature being further elevated until the air permeable part of the container is sealed in a high vacuum by the melted soldering material.

The sealed reaction system thus obtained is placed in a high temperature high pressure vessel as shown in FIG. 2 and then in an ultrahigh pressure high temperature apparatus. The reaction system is heated under the pressure and temperature conditions under which diamond is stable and at a temperature higher than the eutectic temperature of the catalytic metal and the carbonaceous material thereby enabling to synthesize and synchronously sinter diamond.

Figure 3:
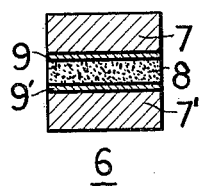
FIG. 3 shows an example of a sample assembly in which carbonaceous raw material and a catalytic metal are constructed in layers.
Figure 4:
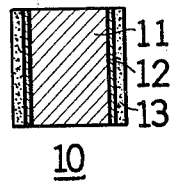
FIG. 4 is also an example of a sample assembly in which the raw materials are constructed concentrically.

The catalytic metal for use in the method of the invention is selected from the known metals. Fe, Ni, Co, Cr, Mn and alloys thereof are preferable. Better results are obtainable if one or two selected from the group comprising Al, Ti and Zr are contained in addition thereto. The reason is as follows. Even though nitrogen gas is removed in vacuum from the reaction system comprising a catalytic metal and carbonaceous material and the said reaction system is protected from nitrogen gas atmosphere when diamond is synthesized, there is a possibility of a very small amount of nitrogen component trapped in the state of solid solution being left unremoved in the reaction system. If Al, Ti or Zr which is ready to react on nitrogen is added to the reaction system, it will capture the nitrogen component remaining in the said reaction system thereby enabling to synthesize diamond containing less nitrogen and having higher thermal conductivity. It is not necessary to add a large amount of Al, Ti or Zr, the preferable range being 1~10% by weight. Al, Ti or Zr may be preliminarily alloyed with the catalytic metal, or used in the form of individual metal powder or foil. Alternatively, it may be used as part or whole of the structural material so that it is alloyed with the catalytic metal during the synthesizing and sintering process. It is preferably formed in the shape of a disk in case of a sample structure as shown in FIG. 3, while it is rolled in the shape of foil around the outer periphery of the graphite in the case as shown in FIG. 4.

The amount of the catalytic metal depends on the amount of the graphite used and the properties expected from the sintered compact. If a catalytic metal in excess of 50% of the total weight of graphite and catalytic metal is used, sintering does not arise between the particles with the catalytic metal remaining therebetween in a large amount, though diamond particles are grown. This is not preferable since thermal conductivity is reduced particularly when intended for use in heat sink material. If the catalytic metal is less than 5 wt %, untransformed graphite is left, and the sintering phenomenon between the diamond particles does not arise. The preferable range, therefore, is between 5~30 wt %.

The carbonaceous material for use in the invention should contain as little impurities as possible. Particularly preferable is high purity graphite for use in spectroscopic analysis.

The inert metal for use in synthesizing diamond according to the invention is placed in contact with carbon as described hereinbefore. Most preferable, therefore, is the metal which can never be a catalyst of diamond, for example, Au, Ag, Cu, Al, Zn, Sn, Pb, etc. A metal having a higher melting point than that of the catalytic metal, even when it produces carbides in reaction with carbon, may be used as an inert metal in the synthesis of diamond according to the invention, for example, Pt, Ti, Zr, Hf, V, Ta, Nb, Mo or W. Among such metals, Au has the most distinguished effect. Such inert metal is interposed between the interface of the catalytic metal and the carbonaceous material as follows: an electro-plating method, vacuum evaporation method, powder coating method, method of inserting foilshaped metal, ion spattering method, etc. Selection may be made in conformity with the required amount, purity, economy, etc. Most preferable in all respects is the vacuum evaporation method. The necessary amount of the inert metal is determined in conformity with the kind of metal, properties of the sintered compact and conditions of temperature elevation. In case of Au which is most preferable, 0.1~5 wt % relative to the catalyst used will bring about satisfactory results. For example, when Ni catalyst has a thickness of 100μ and the temperature elevation speed is 50° C./min, the suitable range of thickness of Au is 500 Å~2μ. When the thickness was less than 500 Å, diamond grown with uniform orientation was not observable, only a mass of fine particles of diamond. When gold foil 5μ in thickness was used, diamond was produced only in a small amount and the sintering was premature.

The pressure and temperature conditions necessitated in obtaining a sintered compact wherein the diamond crystal particles have been grown with uniform orientation are within the area, EFGH, defined by oblique lines in FIG. 1. E-F is a line showing a temperature higher by 200° C. than C-D, the eutectic line of the catalytic metal and carbon, F-G being a line showing a pressure of 65 kb, G-H being a line showing a temperature lower by 100° C. than A-B, the thermodynamic equilibrium line of diamond versus graphite. A pressure of 65 kb is necessitated at the lowest. If the reaction pressure falls short of 65 kb, the carbonaceous raw material, graphite, is liable to be left untransformed into diamond. If the temperature is below the line E-F and above the line C-D, for example, about 1500° C. when Ni catalyst is used, then diamond crystals are not fully grown, though formed. Under the temperature conditions in the neighborhood of the equilibrium line A-B, most of the crystals are not grown in one particular direction but uniformly developed in all directions into a mass of die-like cubes or octahedrons. Therefore, the range defined by E, F, G and H in FIG. 1 is preferable.

The sintered compact obtainable by the method according to the invention has most of its diamond crystals uniformly oriented in the direction of its long axes. Thermal conductivity as high as that of natural diamond single crystal is obtainable by using the said direction as the direction of thermal conduction. Since the diamond particles constituting the sintered compact have an elongated shape with their long axes having a length of about 200μ, the number of grain boundaries is small relative to the direction of thermal conduction, whereas the thickness required for heat sink material of the semiconductor device is generally 300~500μ.

Furthermore, the sintered compact according to the invention has electric conductivity since it contains a catalytic metal and has a continuous metal phase. Thus, the sintered compact according to the invention, when intended for use in heat sink material requiring electric conductivity, such as semiconductor laser, can satisfactorily combine the role of an electrode.

However, when intended for use in such heat sink material as Impatt diode or Gun diode, electric insulation is required in reverse. In such a case too, dielectric properties can be imparted to the sintered compact by treating it in a strong acid, such as aqua regia etc. thereby dissolving and removing the catalytic metal contained therein so that it can be utilized as heat sink material for this purpose. For example, a sintered compact having a proper resistance of 0.1Ω cm can be made into a sintered compact having a proper resistance of about $10^{15}$ order by treating it in boiling aqua regia for 24 hours.

As a result of an examination of the uniformly oriented crystals of the sintered compact according to the invention, it was found that they were crystallographically oriented. To be more precise, {111} planes were formed in parallel with the plane normal to the direction of growth of the diamond crystal. A wire drawing die and dresser of high performance are obtainable by making use of such orientation. According to "Physical properties of Diamond" by R. Bellman referred to hereinbefore, the wear resistance of diamond depends on the direction of the crystal planes, and the highest wear resistance is obtainable from the direction $<100>$ of $\{100\}$ planes. In other words, a wire drawing die having high wear resistance is obtainable by boring the wire drawing hole in the direction normal to $\{100\}$ planes. The wire drawing die thus obtained is most satisfactory since it has the highest resistance also to cleavage in the said direction. The aforesaid direction $<100>$ of $\{100\}$ planes can be easily determined by making use of the crystallographical orientation, and a wire drawing die or dresser having high resistance to wear and cleavage is obtainable by determining the said direction.

In case of drawing high carbon steel wire, it is particularly necessary that the temperature of the die is not elevated so that the wire material is free from the thermal influence. The diamond sintered compact according to the invention has a very high thermal conductivity, and the friction heat produced during the wire drawing process is quickly transmitted to the outside thereby enabling to prevent the die temperature from being perceptibly elevated.

The sintered compact according to the invention is particularly suitable for a drawing die in such field with its high thermal conductivity combined with its high wear resistance.

The invention will now be described in more detail in reference to the following examples.

EXAMPLE 1

Referring to FIG. 4, a circular rod 11 of spectroscopic high purity carbon 6 mm in diameter, 10 mm in height and 470 mg in weight was used as carbonaceous material. A Ni-Cr plate (JIS No. 1) 0.1 mm in thickness was used as a catalytic metal 13. The weight thereof was 160 mg, and 25% of the whole weight. As an inert metal 12, Au film was deposited onto the Ni-Cr plate to a thickness of 3000 Å by vacuum evaporation. The said plate was rolled around the outer periphery of the graphite circular rod 11 so that the vapor deposited surface may be brought into contact therewith to prepare a sample structural body 10. The sample thus prepared was placed in the high temperature and high pressure vessel shown in FIG. 2. The pressure was raised to 70 kb, and then quick heating was effected under such conditions that the temperature was elevated to L in FIG. 1 (1300° C.) in 3 minutes, and then to M in one minute. Ultimately, the pressure and the temperature were held at 70 kb and 1900° C. respectively for 10 minutes. Subsequently, the temperature was lowered and then the pressure was reduced to that of atmospheric to obtain a disk-shaped reaction compact. The sintered compact thus obtained was found to have been tightly bonded. It was cut in the direction of thickness and the sectional surface was polished to observe the structure thereof. It was found that the diamond crystal particles radially grown from the outer periphery toward the center were uniformly oriented in layers in the direction of thickness as typically illustrated in FIG. 10. The short axis had a length of $40\sim60\mu$, while the long axis had a length of $100\sim300\mu$. The diamond crystal particles had been tightly bonded to each other, and the catalytic metal used was observed in pattern the grain boundary. An X-ray diffraction pattern of the reaction compact showed that the graphite used had been completely transformed into diamond. It was also found that the sintered compact was crystallo-graphically oriented in the particular direction. To be more precise, as a result of incidence of X-rays (CuK$_1$) to the smooth surface of the disk-shaped reaction compact, the X-ray diffraction peak obtained was restricted to a reflection from the $\{111\}$ planes, reflections from others such as $\{220\}$ planes, $\{311\}$, $\{400\}$ etc. being very small, for example, $2\sim4$ when the strength of reflection from the $\{111\}$ planes was set at 100. In other words, the disk-shaped diamond sintered compact was constituted by the $\{111\}$ planes parallel with the smooth surface thereof. A rectangular sample was cut from the disk-shaped sintered compact to measure the thermal conductivity in the direction of growth of diamond. The value was 1.9 cal/cm/sec/° C., a value similar to that of type Ia crystal of natural diamond, and suitable for heat sink material. In order to find the suitable weight ratio of the catalytic metal, the following tests. A and B, were made.

(A) The test conditions were the same as in Example 1 except that the catalytic metal was a Ni-Cr plate having a thickness of 0.4 mm. The weight ratio thereof was 58%. An observation of the disk-shaped reaction compact thus obtained showed that elongated diamond particles had been grown in the catalytic metal as matrix, and the part wherein diamond particles had been bonded to each other was relatively small, that is, about 30% of the whole sectional area. The thermal conductivity of the reaction compact measured under the same conditions as in Example 1 was 0.3 cal/cm. sec.° C., which was unsuitable for heat sink material.

(B) The conditions were the same as in Example 1 except that the catalytic metal was a Ni-Cr foil having a thickness of $10\mu$. The weight ratio thereof was 3.3%. In the disk-shaped reaction compact thus obtained, untransformed graphite was found to be present over the central part about 2 mm in diameter. An observation of the sectional surface showed that graphite was left untransformed also in the area wherein diamond had been grown but diamond particles had not been bonded to each other.

EXAMPLE 2

Disks 7, 7' having a diameter of 6 mm and a thickness of 5 mm of spectroscopic high purity graphite was used as carbonaceous material. A disk of Permalloy (55 Fe-45 Ni) having a thickness of $50\mu$ was used as a catalytic metal with Au film desposited onto both faces thereof to a thickness of 1000 Å by vacuum evaporation. A sample assembly 6 was prepared as shown in FIG. 3 and placed in the high temperature and high pressure vessel as shown in FIG. 2. The assembly was subjected to a pressure of 73 kb with the temperature elevated to 1200° C. indicated at L in FIG. 1 in 5 minutes, and then to 2000° C. indicated at M in 2 minutes. Ultimately, the pressure and the temperature were held at 73 kb and 2000° C. respectively for 5 minutes. Then, the temperature and the pressure were lowered in the order mentioned to obtain a disk-shaped tightly bonded reaction compact. The sectional surface of the reaction compact thus obtained was in a state as typically shown in FIG. 9. An X-ray diffraction pattern showed that graphite had been completely transformed into diamond and been oriented in the particular direction. The thermal conductivity in the direction of thickness of the disk-shaped compact was 2.8 cal/cm.sec.°C., which was even higher than the corresponding value of type Ia crystal of natural diamond. Accordingly, the sintered compact was found to be suitable for heat sink material.

EXAMPLE 3

In order to find the preferable conditions of pressure and temperature, tests were made under the conditions as shown in Table 1. The materials and the structure were the same as in Example 1. The temperature was elevated to L in FIG. 1 in 2 minutes, and then to the respective levels predetermined for the tests in 1 minute. The ultimate temperatures were maintained for 10 minutes, respectively. In Table 1, the mark 0 shows a preferable sintered compact wherein crystal particles grown in uniform orientation have been bonded to each other. The mark Δ shows a sintered compact wherein crystal particles have been grown without orientation. The mark x shows a sintered compact wherein graphite is partially left untransformed. The eutectic temperature of Ni-Cr catalyst and carbon is about 1300° C.

TABLE 1

| Test No. | Pressure (kb) | Temperature (°C.) | Sintered Compact |
|---|---|---|---|
| 1 | 60 | 1600 | X |
| 2 | 63 | 1800 | X |
| 3 | 70 | 1400 | Δ |
| 4 | 67 | 1800 | O |
| 5 | 67 | 2100 | Δ |
| 6 | 70 | 2100 | O |
| 7 | 75 | 2000 | O |

EXAMPLE 4

Tests as shown in Table 2 were made in order to examine the effect of the kind and volume ratio of the inert metals. Ni foil 50μ in thickness was used as a catalytic metal. The conditions were the same as in Example 1 except that the time of temperature elevation from L to M in FIG. 1 was set at 10 minutes.

TABLE 2

| Test No. | Kind | Thickness or weight | Method |
|---|---|---|---|
| 8 | Au | 500Å | Vacuum evaporation |
| 9 | Au | 5000Å | " |
| 10 | Au | 5μ | Gold foil used |
| 11 | Cu | 1μ | Electro-plating |
| 12 | Zn | 1μ | " |
| 13 | Ag | 5 mg | Powder coating |
| 14 | Ti | 1000Å | Spattering |
| 15 | W | 500Å | " |

It was found that crystal particles had been grown without orientation in Test No. 10. The best result was shown by Test No. 9 followed by Test Nos. 8, 13, 11, 14, 15 and 12 in the order mentioned. Compared with Test No. 9, the rest were inferior in respect of orientation of the crystals. Each crystal, however, was found to have an elongated shape with the length of the long axis in the ratio of about 1.5~2 relative to that of the short axis. Accordingly, their effectiveness was confirmed.

EXAMPLE 5

Wear resistance of the sintered compact according to the invention was tested by making use of a Ni-Cr disk (JIS No. 1) having a thickness of 0.2 mm with Au film diposited onto both faces thereof to a thickness of 2000 Å by vacuum evaporation. A tightly sintered disk-shaped reaction compact was obtained under the same conditions as in Example 4 except the aforesaid catalytic metal. An X-ray diffraction pattern showed that not only graphite had been completely transformed into diamond without a trace of residue thereof in the sintered compact, but also the particles showed a crystallographical orientation. Based on the said orientation, the direction <100> of the {100} planes was compacted, and a wire drawing die was produced by boring a hole in the said direction.

By way of comparison, a stainless steel wire drawing test was made by making use of a die made of the diamond sintered compact according to the invention and a die produced from a commercial diamond sintered compact made of diamond powder sintered with a bonding material principally consisting of Co. As a result, the die made of the sintered compact according to the invention showed about three times as high wear resistance as that of the commercial die. In a drawing test of high carbon steel wire containing 0.8% carbon, the temperature of the commercial die was elevated to 150° C., while that of the die according to the invention was limited to 100° C. thereby enabling to greatly reduce the thermal influence on wire material.

EXAMPLE 6

The following test was made in order to examine the individual effect of the temperature elevation speed on the construction of the sintered compact according to the invention, that is, the orientation and configuration of each of the crystals.

As carbonaceous material, disks 7, 7' of spectroscopic high purity graphite 6 mm in diameter and 5 mm in thickness were used. A disk of Ni-Cr (JIS No. 1) having a thickness of 0.2 mm was used as a catalytic metal, and no inert metal was used. The sample assembly as shown in FIG. 3 was placed in a high temperature high pressure vessel shown in FIG. 2. The said assembly was subjected to a pressure of 73 kb, and then the temperature was elevated to 1300° C., the level indicated at L in FIG. 1, in 5 minutes. Then, the temperature was further elevated to 2200° C., the level indicated at M in the same figure, under four different conditions of 1, 5, 15 and 30 minutes, respectively. Ultimately the pressure and the temperature were maintained at 73 kb and 2200° C. respectively for 15 minutes, and then lowered in the order of temperature and pressure.

The results of observation of the sectional face of the tightly bonded disk-shaped sintered compact are shown in Table 3, wherein the symbol n shows the ratio of the length of the long axis to that of the short axis of each individual diamond particle constituting the sintered compact.

TABLE 3

| Test No. | Time of Temp. Elevation | Speed of Temp. Elevation | Construction of Sintered Compact |
|---|---|---|---|
| 16 | 1 min | 900° C./min | More than 90% of the particles are oriented in the direction of thickness with an elongated shape of n = 2.5 ~ 5. |
| 17 | 5 min | 180° C./min | More than 75% of the particles are oriented in the direction of thickness with an elongated shape of n = 2 ~ 3. |
| 18 | 15 min | 60° C./min | The particles are not perceptibly oriented though formed into a relatively elongated shape of n = 1.5 ~ 2. |

TABLE 3-continued

| Test No. | Time of Temp. Elevation | Speed of Temp. Elevation | Construction of Sintered Compact |
|---|---|---|---|
| 19 | 30 min | 30° C./min | n = 1 ~ 1.5 No orientation of the particles is observable. |

Prior to observation of the sectional faces of the sintered compacts, thermal conductivity in the direction of thickness of the disks was measured. As a result, the value of Test no. 16 was 2.3 cal/cm.sec.°C., and that of Test No. 19 was 1.2 cal/cm.sec.°C., at room temperature respectively. These values are substantially equal to that of type Ia single crystal of natural diamond. The difference between the values of the two sintered compacts is understood to have come from the difference of the constructions thereof.

EXAMPLE 7

Figure 8:
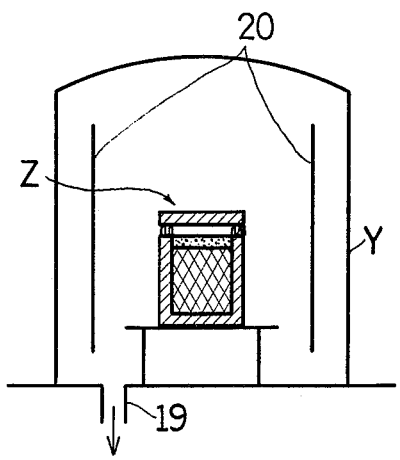
FIG. 8 is a longitudinal sectional view of a vacuum furnace.

A container 14 made of Mo 6.1 mm in inside diameter, 8 mm in outside diameter, 12 mm in height and 2 mm in thickness in the bottom part thereof as shown in FIG. 5 was produced. As carbonaceous material 18, spectroscopic high purity graphite formed into a circular rod 6 mm in diameter and 9.6 mm in height was inserted into the container 14. The weight was about 450 mg. On the carbonaceous material 18 was placed a nichrome disk of JIS No. 1 (80 Ni-20 Cr) 6 mm in diameter and 0.4 mm in thickness as a catalytic metal 17. The weight was about 90 mg, the weight ratio being about 17%. An annular porous pressed body of pure copper powder was placed on the container 14 as soldering material 16. Further thereon was placed a disk 15 made of Mo 8 mm in outside diameter and 2 mm in thickness as a lid of the container 14. The assembled body Z thus prepared was placed in a predetermined position in vacuum furnace Y as shown in FIG. 8 and heated to 1000° C. under the degree of vacuum of $3~6\times10^{-6}$ Torr. The temperature was maintained as it stood for 5 hours for degassing, and subsequently elevated to 1150° C. thereby enabling the soldering material to melt and seal the container in vacuum synchronously.

The vacuum sealed container was placed in a sample chamber 5 of the high temperature and high pressure vessel as shown in FIG. 2. By means of an ultrahigh pressure high temperature apparatus, the pressure was raised to 70 kb and then quick heating was effected by elevating the temperature to 1300° C. indicated at L in FIG. 1 in 3 minutes, and then from L to M in 1 minute. Ultimately the pressure and the temperature were held at 70 kb and 1900° C. respectively for 10 minutes. Subsequently, the temperature was lowered and then the pressure was reduced to that of atmospheric to obtain a disk-shaped reaction compact. It was found that the sintered compact thus obtained was tightly bonded and had a thermal conductivity of 2.6 cal/cm.sec.°C. in the direction of thickness, which was higher than that of type Ia single crystal of natural diamond.

An observation of the sectional surface of the said sintered compact showed that it had a structure as typically illustrated in FIG. 9. An X-ray diffraction pattern showed that the graphite used had been completely transformed into diamond.

EXAMPLE 8

Referring to FIG. 7, a double-sleeved container made of Ti having a bottom was produced. The inner sleeve 14' had an inside diameter of 6.1 mm and an outside diameter of 7 mm , while the outer sleeve 14 had an inside diameter of 7.2 mm and an outside diameter of 8 mm, the height being 11 mm and the thickness of the bottom part being 1 mm, respectively.

A clearance of 0.1 mm was provided on one side between the inner and outside sleeves so as to facilitate the escape of gas from the inside at the time of evacuation. Into the inner sleeve 14' were inserted in layers a disk made of 85 Fe—10 Ni—5 Al alloy 70 mg in weight as a catalytic metal 17 and a circular rod of spectroscopic high purity graphite 450 mg in weight as carbonaceous material 18. The weight ratio of the catalytic metal was 13.5%.

The inner sleeve 14' filled with the said reaction materials was placed on a bottom plate 15 consisting of a disk made of Ta 8 mm in outside diameter and 0.2 mm in thickness with interposition of soldering material 16 consisting of a pure copper plate having a thickness of 0.1 mm.

Then, the outer sleeve 14 was fitted around the inner sleeve 14'. The assembled body Z' thus prepared was heated to 1000° C. under the degree of vacuum of $3~6\times10^{-6}$ Torr in a vacuum furnace Y. The temperature was held as it stood for 3 hours so as to degas the reaction system. Then, the temperature was further elevated to 1150° C. so as to melt the soldering material thereby enabling it to flow into and fill the clearance between the inner and outer sleeves and synchronously seal the container in vacuum by bonding the Ta-made bottom plate thereto.

The sealed container in vacuum was placed in the sample chamber the same as in Example 7. By means of an ultrahigh pressure high temperature apparatus, the pressure was raised to 73 kb and the temperature was elevated to 1200° C. indicated at L in FIG. 1 in 5 minutes, and then to 2000° C. indicated at M in 2 minutes. Ultimately, the pressure and the temperature were held at 73 kb and 2000° C. respectively for 5 minutes. Subsequently, the temperature and then the pressure were lowered to obtain a disk-shaped tightly bonded reaction compact.

The disk-shaped diamond sintered compact thus obtained was found to have a thermal conductivity of 3.5 cal/cm.sec.°C. in the direction of thickness, which was suitable for heat sink material.

EXAMPLE 9

A double sealed container the same as in Example 8 was used. The container was made of Mo. A variety of metals as shown in Table 4 were used as catalytic metals 17. The weight ratio thereof was 12%, respectively. In other respects, the conditions were the same as in Example 8. The result of tests of the thermal conductivity of the diamond sintered compacts thus obtained are shown in Table 4.

TABLE 4

| Composition of Catalytic Metal | Thermal Conductivity (cal/cm . sec. °C.) |
|---|---|
| 55Fe—45Ni | 2.8 |
| 80Ni—20Mn | 2.5 |
| 75Fe—20Ni—5Co | 2.7 |
| 95Fe—5Al | 3.2 |
| 96Ni—4Ti | 3.1 |
| 41Fe—35Co—18Ni—6Al | 3.3 |

What is claimed is:

1. A polycrystalline diamond sintered compact containing 5-30 weight % of a catalytic metal for synthesizing diamond from a carbonaceous raw material, said sintered compact being constituted by individual crystal particles each of which has a long axis more than 2 times the length of its short axis, the long axes of more than 50% of said crystal particles being uniformly oriented in the direction of the thickness of said sintered compact or in the direction normal thereto, said crystal particles forming a substantially continuous diamond phase by being bonded to each other in the direction of the long axes thereof.

2. The sintered compact according to claim 1, wherein said long axis has a length of 50-400$\mu$, and said short axis has a length of 20-80$\mu$.

3. The sintered compact according to claim 1, wherein said catalytic metal is selected from the group consisting of Fe, Ni, Co, Cr, Mn and alloys thereof.

* * * * *